(12) United States Patent
Sneh

(10) Patent No.: US 11,188,157 B1
(45) Date of Patent: Nov. 30, 2021

(54) TOUCHLESS INPUT DEVICE WITH SENSOR FOR MEASURING LINEAR DISTANCE

(71) Applicant: Meir Sneh, Nahariya (IL)

(72) Inventor: Meir Sneh, Nahariya (IL)

( * ) Notice: Subject to any disclaimer, the term of this patent is extended or adjusted under 35 U.S.C. 154(b) by 0 days.

(21) Appl. No.: 17/152,827

(22) Filed: Jan. 20, 2021

Related U.S. Application Data

(60) Provisional application No. 63/027,378, filed on May 20, 2020.

(51) Int. Cl.
| | | |
|---|---|---|
| G06F 3/02 | (2006.01) | |
| G06F 3/03 | (2006.01) | |
| G06F 3/01 | (2006.01) | |
| G06F 3/16 | (2006.01) | |

(52) U.S. Cl.
CPC ............ *G06F 3/0202* (2013.01); *G06F 3/017* (2013.01); *G06F 3/0304* (2013.01); *G06F 3/167* (2013.01)

(58) Field of Classification Search
CPC ...... G06F 3/017; G06F 3/0202; G06F 3/0304; G06F 3/167
See application file for complete search history.

(56) References Cited

U.S. PATENT DOCUMENTS

| | | | |
|---|---|---|---|
| 5,892,491 | A | 4/1999 | Fukatsu |
| 7,620,316 | B2 | 11/2009 | Boillot |
| 8,354,997 | B2 | 1/2013 | Boillot |
| 8,614,669 | B2 | 12/2013 | Marc |
| 9,658,723 | B2 | 5/2017 | Guarneri et al. |
| 2003/0132913 | A1 | 7/2003 | Issinski |
| 2008/0291156 | A1 | 11/2008 | Dietz et al. |
| 2012/0256839 | A1 | 10/2012 | Suggs |
| 2014/0022216 | A1 | 1/2014 | Nakamura |
| 2014/0028378 | A1 | 1/2014 | Rostamianfar et al. |
| 2014/0236454 | A1 | 8/2014 | Mattes et al. |

(Continued)

FOREIGN PATENT DOCUMENTS

| | | |
|---|---|---|
| CN | 203359713 | 12/2013 |
| CN | 204425307 | 6/2015 |

(Continued)

OTHER PUBLICATIONS

AirxTouch "The Touchless Interactive Kiosk", AirxTouch® Kiosk, Product Description, 4 P., 2020.

(Continued)

*Primary Examiner* — Michael Pervan

(57) ABSTRACT

An input assembly comprises a plurality of visual indicators differentiating between key regions on a plane. The input assembly also comprises a plurality of sensors, each arranged behind one of the key regions, and configured to determine a linear distance of the object from each of the sensors when the object is coming into proximity with the plane. Processing circuitry is configured to, based on input from the sensors, determine a location of a selected key region that the object is approaching; instruct changing of a display of at least one of the plurality of visual indicators to highlight the selected key region with a first visual indication when an object approaches within the first predefined proximity of the selected key region; select, from among a plurality of values, a value that is associated with the selected key region, and output the selected value as a user-selected keypad value.

19 Claims, 10 Drawing Sheets

(56) References Cited

U.S. PATENT DOCUMENTS

| | | |
|---|---|---|
| 2015/0185857 A1 | 7/2015 | Jung |
| 2015/0205358 A1 | 7/2015 | Lyren |
| 2016/0041650 A1 | 2/2016 | Roziere et al. |
| 2016/0224235 A1 | 8/2016 | Forsstrom et al. |
| 2018/0354746 A1 | 12/2018 | Blanchard |
| 2019/0265828 A1* | 8/2019 | Hauenstein ........... G06F 3/0416 |

FOREIGN PATENT DOCUMENTS

| | | |
|---|---|---|
| CN | 106341108 | 1/2017 |
| KR | 10-1460028 | 11/2014 |
| KR | 2017-0007573 | 1/2017 |
| KR | 2017-0136176 | 12/2017 |
| WO | WO 2005/116801 | 12/2005 |

OTHER PUBLICATIONS

J-Tech "Touchless Keyboard/Contactless Keyboard/Toucless Button for iPad, Mac, and Windows: Customizable Keys Can Be Pressed Without Any Physical Contact", J-Tech, Blog and Video, 2 P., Aug. 25, 2020.
Korea Polytechnic "Contactless Elevator/Elevator", Korea Polytechnic, Product Description, 2 P., 2020.
Neonode "Neonode's Holographic Contactless Touch for Elevators", Video, 2020.
Neonode "Why I Invested in Neonode Inc's Contacless Holographic Touch", Video, Press Release, Aug. 15, 2020.
Pongee "Waterproof Contactless Infrared Sensor Exit Button". Pongee, Product Description, 9 P., 2020.
YouTube "Anigmo Touchless Switches—Touchless Activation", YouTube, Video, 3 P., 2020.

\* cited by examiner

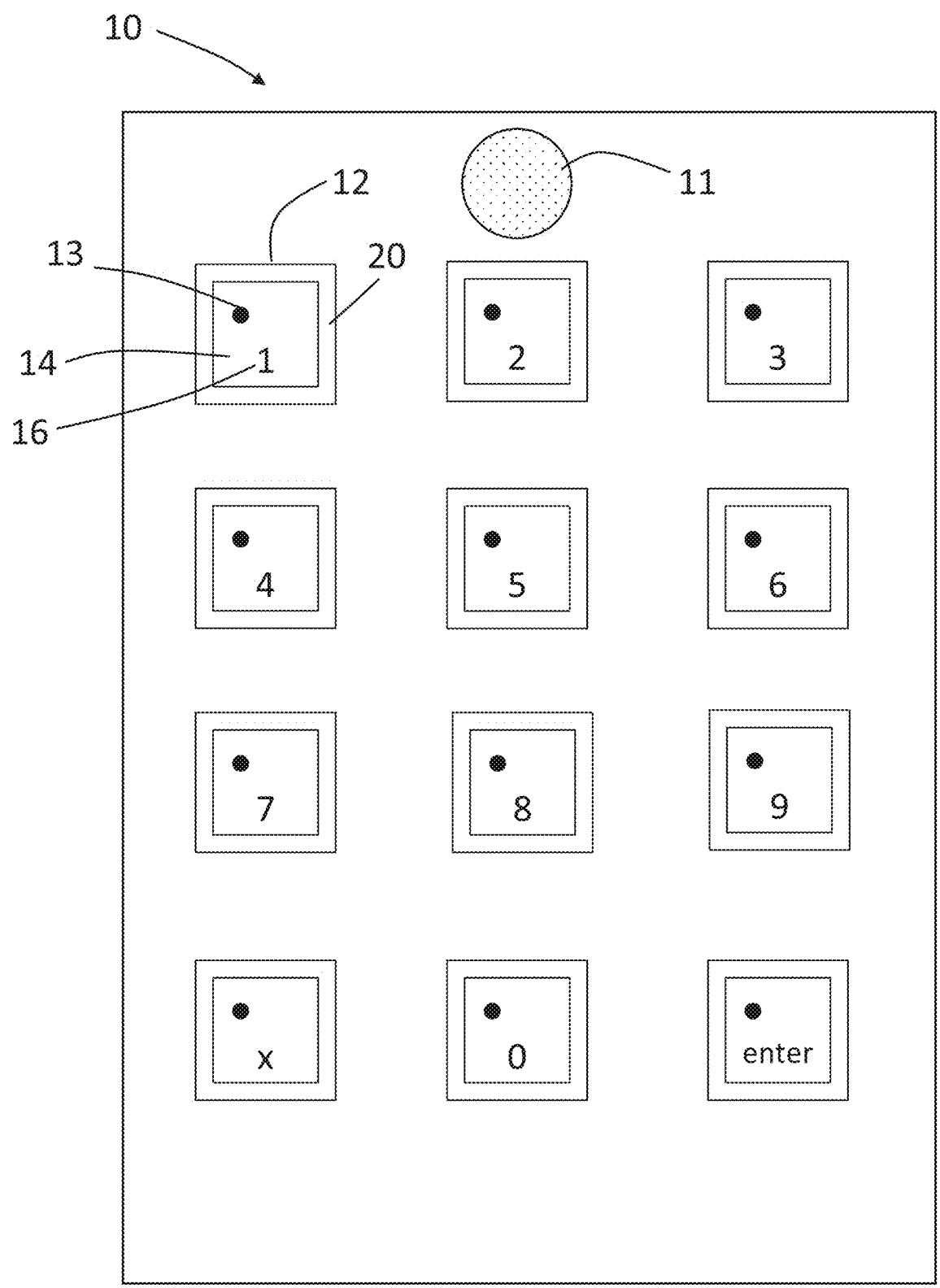

TOUCHLESS INPUT DEVICE WITH SENSOR FOR MEASURING LINEAR DISTANCE

RELATED APPLICATION/S

This application claims the benefit of priority under 35 USC § 119(e) of U.S. Provisional Patent Application No. 63/027,378 filed on May 20, 2020, the contents of which are incorporated by reference as if fully set forth herein in their entirety.

FIELD AND BACKGROUND OF THE INVENTION

The present invention, in some embodiments, relates to a touchless input device, and more specifically, but not exclusively, to a touchless input device with a plurality of time of flight sensors capable of measuring linear distance providing feedback to a user as an object approaches the input device.

Electrical equipment at public places such as air conditioners, fans, lamplights, and elevator operating buttons, as well as password input keyboards such as at a bank ATM are known to be cross-spreading carriers of various kinds of epidemics, bacteria, and viruses.

Contactless input entry systems are generally known. For example, a contactless input entry system may project an array of lasers in front of a display. The display may be, for example, an elevator key panel. When an object, such as a user's finger, through a certain laser that appears to be projected from a certain key, the system registers a selection of that key. In other examples, an infrared or proximity sensor is used to detect an approach of a user's hand to a particular key in a key panel.

SUMMARY OF THE INVENTION

Existing contactless input entry systems generally provide feedback to a user in only a binary fashion. The system displays one type of feedback before a selection, and a second type of feedback after a selection. For example, in the case of a contactless elevator keypad, the keypad will display feedback only after a user has "selected" a particular key. The user has no way of knowing that he or she is about to select a key until after he or she has already done so. In addition, existing contactless input entry systems rely on sensors that have limited resolution, and are unable to distinguish, for example, between a finger and a hand. To compensate for this limited resolution, the keys of such contactless input entry systems must be separated sufficiently so that selection of one key will not trigger a false positive for selection of another key. This necessity for separation limits the applicability of such contactless input entry systems to devices that typically use small keypads, such as ATM machines, credit card readers, or alarm system terminals.

According to a first aspect, an input assembly comprises a plurality of visual indicators differentiating between a plurality of key regions on a plane. The input assembly also comprises a plurality of sensors, each respective sensor arranged behind one of the plurality of key regions, and configured to determine a linear distance of an object from the respective sensor when the object is coming into proximity with the plane. The input assembly further comprises processing circuitry. The processing circuitry is configured to determine the linear distance of the object from each of the plurality of sensors; determine a rate of approach of the object to each of the plurality of sensors, as a vector, based on a derivative of the linear distance; compare values for the linear distance and rate of approach for each of the plurality of sensors, to thereby determine a location of a selected key region that the object is approaching; instruct changing of a display of at least one of the plurality of visual indicators to highlight the selected key region with a first visual indication when an object approaches within the first predefined proximity of the selected key region; select, from among a plurality of values, a value that is associated with the selected key region, and output the selected value as a user-selected keypad value. Advantageously, the aggregation of information from the plurality of sensors measuring linear distance enables the input assembly to determine the approach of an object with a high degree of accuracy, permitting the key regions to be placed significantly closer to each other as compared to a system without the ability to measure linear distance.

In another implementation according to the first aspect, the visual indicators are displayed on a single contiguous screen. In another implementation according to the first aspect, the visual indicators are located on separate keys in a keypad. Advantageously, the system is capable of functioning equally well regardless of the supporting structure in which it is configured.

In another implementation according to the first aspect, the input assembly further comprises circuitry for selecting the value associated with the respective key region by touching or depressing a key surface associated with the respective key region. The circuitry may be, for example, a switch that is engaged via depression of the key, or a region of a touch screen. Advantageously, the input assembly functions in parallel as a contactless input entry system and as a conventional input entry system. This dual functionality permits the system to receive input entries even in the event that one of the systems is temporarily nonfunctional.

In another implementation according to the first aspect, the input assembly further comprises a speaker. The processing circuitry is configured to instruct the speaker to output an audible indication from the speaker when the object approaches within the first predefined proximity of the respective key region. Advantageously, the audible indication allows the assembly to give feedback even in situations when visual indications could not be easily recognized, for example for users with visual impairments, or in the dark.

In another implementation according to the first aspect, the processing circuitry is configured to instruct the light source to display the first visual indication only when the object is determined to be a finger or an object no larger than a finger. Advantageously, the capability of the input assembly to distinguish objects of this size allows for ruling out of false positives, for example, when a user inadvertently passes a handbag or an entire hand close to the input assembly. It also allows the key regions of the input assembly to be configured comparatively close to each other.

In another implementation according to the first aspect, a diameter of each key region is less than 20 mm. The typical adult human index finger has a width of 16-20 mm, and the typical size of a key on a computer keypad is around 19 mm. Thus, each key region is no wider than an adult index finger or a typical computer key. This allows for the input assembly to be configured within a small keypad, such as one typically found on an alarm system or on an ATM.

In another implementation according to the first aspect, the first visual indication is a change in color of light or a change in degree of brightness in light. For example, the light color may change from red to green, or the light may change from a lower to higher level of brightness. This provides a clear indication of a selection of a key region.

In another implementation according to the first aspect, the processing circuitry is configured, based on input from the plurality of image sensors, to instruct highlighting the selected key region with a second visual indication when an object approaches within a second predefined proximity of the selected key region. The second predefined proximity is further from the respective key surface than the first predefined proximity. The processing circuitry is further configured to instruct the light source to display a second visual indication when the object is within the second predefined proximity. The processing circuitry is further configured to instruct the light source to incrementally change the second visual indication as the object moves from the second predefined proximity to the first predefined proximity. Optionally, the second visual indication is a light pattern formed around the perimeter of the visual indicator of the selected key region or in an area behind the visual indicator of the selected key region. Optionally, the light pattern is displayed around a limited portion of the perimeter or area when the object enters the second predefined proximity, and is gradually extended to a greater portion of the perimeter or area as the object is moved from the second predefined proximity to the first predefined proximity. Optionally, the light pattern is displayed around the perimeter or area at a first intensity when the light enters the second predefined proximity, and is projected in increasing intensity as the object is moved from the second predefined proximity to the first predefined proximity. Advantageously, the incremental change in the light pattern as the object approaches the first predefined proximity provides continuous feedback to the user as his or her finger approaches the first predefined proximity, thus enabling the user to assess how much further is necessary to move his or her finger in order to effect a selection.

Optionally, the processing circuitry is configured, based on input from the plurality of image sensors, to determine a withdrawal of the object from the first predefined proximity to the second predefined proximity, and instruct reversal of the second visual indication incrementally as the object moves from the first predefined proximity to the second predefined proximity. Optionally, the second visual indication is a light pattern formed around a perimeter of the visual indicator of the respective key region or in an area behind the visual indicator of the selected key region. Optionally, the light pattern is reversed from a greater portion of the perimeter or surface to a lesser portion of the perimeter or surface as the object is moved from the first predefined proximity to the second predefined proximity. Optionally, the light pattern is reversed from a greater intensity to a lesser intensity as the object is moved from the first predefined proximity to the second predefined proximity. Advantageously, the input assembly provides visual feedback to a user as he or she withdraws the object from the input assembly, thereby allowing the user to determine how much further it is necessary to remove the object in order to complete the reversal of a selection of a respective key.

In another implementation according to the first aspect, the processing circuitry is configured to recognize a pattern of selection of values, and, upon recognition of the pattern, to instruct performance of an action by an electronic device connected to the input assembly. For example, the action may be unlocking of a door or calling an elevator. Optionally, the pattern is a sequence of alphanumeric characters, wherein each of the alphanumeric characters is associated with a respective key region. Advantageously, the input assembly may thus be adapted for use in systems that require unlocking with a security code.

Optionally, the pattern is a gesture formed in reference to the entire input assembly. Advantageously, the plurality of image sensors is able to track an object across the entire input assembly, as opposed to only specific key surfaces. The combination of images obtained by the image sensors is thus capable of tracking a pattern traced by the user, such as a shape of a letter.

In another implementation according to the first aspect, each of the plurality of sensors is a time of flight sensor. Time of flight sensors are regularly used to calculate linear distance.

In another implementation according to the first aspect, the processing circuitry is configured to define three proximity regions relative to the key regions. The three proximity regions include a first region comprising linear distances further than a first predefined distance, a second region comprising linear distances closer than the first predefined distance and further than a second predefined distance, and a third region at or closer than the second predefined distance. When the processing circuitry determines that the object moves from the third region to the second region and then from the second region to the first region, the processing circuitry instructs displaying the first visual indication and selecting of the value. When the processing circuitry determines that the object moves from the first region to the second region and then directly from the second region to the first region, without entering the third region, the processing circuitry does not instruct displaying the first visual indication and selecting of the value. The processing circuitry thus incorporates hysteresis, in that the movement from the second proximity region to the first proximity region generates a selection of a value only if the object had previously been in the third proximity region. The hysteresis serves to exclude unintentional sequential selections. This hysteresis is possible only with a sensor that is capable of measuring linear distance.

In another implementation according to the first aspect, the processing circuitry is configured to determine the location of the selected region through triangulation. For example, given data from any two sensors, it is possible to determine the location of the object based on the distance between those sensors and the vector of approach of the object to each of those sensors. It is further possible to improve the calculation by performing triangulation with more than two sensors, for example, with all the sensors in the array. In another implementation according to the first aspect, each of the plurality of sensors is an image sensor. An image sensor is able to determine an approach of an object with a high degree of resolution and thus may also be used to determine linear distance. The image sensor may be a CCD pixel array. Advantageously, a CCD pixel array is a simple, inexpensive form of image sensor that is capable of performing the functions described herein.

According to a second aspect, an input assembly comprises a button. A time of flight sensor is arranged behind the button and is configured to determine a linear distance of an object coming into proximity with the input assembly. Processing circuitry is configured to: based on input from the time of flight sensor, instruct changing of a display of the button with a first visual indication when the object approaches within a first predefined proximity of the button surface; instruct changing a display of the button with a second visual indication when the object is within a second predefined proximity of the button surface, said predefined proximity being further from the respective key surface than the first predefined proximity; instruct incrementally changing the second visual indication as the object moves from the second predefined proximity to the first predefined proximity; and output a selection of the button when the object approaches within the first predefined proximity. Advantageously, the incremental change in the light pattern as the object approaches the first predefined proximity provides continuous feedback to the user as his or her finger approaches the first predefined distance, thus enabling the user to assess how much further is necessary to move his or her finger in order to effect a selection.

In another implementation according to the second aspect, the processing circuitry is configured to define three proximity regions relative to the button. The three proximity regions include a first region comprising linear distances further than a first predefined distance, a second region comprising linear distances closer than the first predefined distance and further than a second predefined distance, and a third region at or closer than the second predefined distance. When the processing circuitry determines that the object moves from the third region to the second region and then from the second region to the first region, the processing circuitry instructs displaying the first visual indication and selecting of the value. When the processing circuitry determines that the object moves from the first region to the second region and then directly from the second region to the first region, without entering the third region, the processing circuitry does not instruct displaying the first visual indication and selecting of the value. The processing circuitry thus incorporates hysteresis, in that the movement from the second proximity region to the first proximity region generates a selection of a value only if the object had previously been in the third proximity region. The hysteresis serves to exclude unintentional sequential selections. This hysteresis is possible only with a sensor that is capable of measuring linear distance.

According to a third aspect, a method for providing feedback with an input assembly is disclosed. The input assembly comprises a plurality of visual indicators differentiating between a plurality of key regions on a plane. The input assembly further comprises a plurality of sensors, each arranged behind one of the plurality of key regions, and configured to determine a linear distance of an object coming into proximity with the plane. The input assembly further comprises processing circuitry. The method comprises: determining the linear distance of the object from each of the plurality of sensors; determining a rate of approach of the object to each of the plurality of sensors, as a vector, based on a derivative of the linear distance; comparing values for the linear distance and rate of approach for each of the plurality of sensors, to thereby determine a location of a selected key region that the object is approaching; instructing changing of a display of at least one of the plurality of visual indicators to highlight the selected key region with a first visual indication when the object approaches within a first predefined proximity of the respective key surface; selecting, from among a plurality of values, a value that is associated with the selected key region; and outputting the selected value as a user-selected value. Advantageously, the aggregation of information from the plurality of sensors measuring linear distance enables the input assembly to determine the approach of an object with a high degree of accuracy, permitting the key regions to be placed significantly closer to each other as compared to a system without the ability to measure linear distance.

In another implementation according to the third aspect, the visual indicators are displayed on a single contiguous screen. In another implementation according to the third aspect, the plurality of key surfaces are located on separate keys in a keypad. Advantageously, the method is capable of functioning equally well regardless of the supporting structure in which the input assembly is configured.

In another implementation according to the third aspect, the input assembly further comprises circuitry for selecting the value associated with the respective key region by touching or depressing a key surface associated with the respective key region. The circuitry may be, for example, a switch that is engaged via depression of the key, or a region of a touch screen. Advantageously, the input assembly functions in parallel as a contactless input entry system and as a conventional input entry system. This dual functionality permits the system to receive input entries even in the event that one of the systems is temporarily nonfunctional.

In another implementation according to the third aspect, the input assembly further comprises a speaker, and the method comprises outputting an audible indication from the speaker when the object approaches within the first predefined proximity of the respective key region. Advantageously, the audible indication allows the assembly to give feedback even in situations when visual indications could not be easily recognized, for example for users with visual impairments, or in the dark.

In another implementation according to the third aspect, the method further comprises displaying the first visual indication only when the object is determined to be a finger or an item larger than a finger. Advantageously, the capability of the input assembly to distinguish objects of this size allows for ruling out of false positives, for example, when a user inadvertently passes a handbag or an entire hand close to the input assembly. It also allows the key regions of the input assembly to be configured comparatively close to each other.

In another implementation according to the third aspect, a diameter of each key region is less than 20 mm. The typical adult human index finger has a width of 16-20 mm, and the typical size of a key on a computer keypad is around 19 mm. Thus, each key region is no wider than as an adult index finger or a typical computer key. This allows for the input assembly to be configured within a small keypad, such as one typically found on an alarm system or on an ATM.

In another implementation according to the third aspect, the first visual indication is a change in color of light or a change in degree of brightness of light. For example, the light color may change from red to green, or the light may change from a lower to higher level of brightness. This provides a clear indication of a selection of a key region.

In another implementation according to the third aspect, the method further comprises, based on input from the plurality of image sensors, highlighting the selected key region with a second visual indication when an object approaches within a second predefined proximity from a respective key surface, said second predefined proximity being further from the respective key surface than the first predefined proximity, and incrementally changing the second visual indication as the object moves from the second predefined proximity to the first predefined proximity.

Optionally, the second visual indication is a light pattern formed around a perimeter of the visual indicator of the selected key region or in an area behind the visual indicator of the selected key region. Optionally, the method further comprises displaying the light pattern around a limited portion of the perimeter or area when the object enters within the second predefined proximity, and gradually extending the light pattern to a greater portion of the perimeter or area as the object is moved from the second predefined proximity to the first predefined proximity. Optionally, the method further comprises displaying the light pattern around the perimeter or area at a first intensity when the object enters within the second predefined proximity, and projecting the light pattern in gradually increasing intensity as the object is moved from the second predefined proximity to the first predefined proximity. Advantageously, the incremental change in the light pattern as the object approaches the first predefined proximity provides continuous feedback to the user as his or her finger approaches the first predefined distance, thus enabling the user to assess how much further is necessary to move his or her finger in order to effect a selection.

In another implementation according to the third aspect, the method further comprises, based on input from the plurality of image sensors, reversing the second visual indication as the object moves from the first predefined proximity to the second predefined proximity. Optionally, the second visual indication is a light pattern formed around a perimeter of the respective key surface or in an area behind the visual indicator of the selected key region. Optionally, the reversing step comprises reversing the light pattern from a greater portion of the perimeter or area to a lesser portion of the perimeter or surface as the object is moved from the first predefined proximity to the second predefined proximity. Optionally, the reversing step comprises reversing the light pattern from a greater intensity to a lesser intensity as the object moves from the first predefined proximity to the second predefined proximity. Advantageously, the input assembly provides visual feedback to a user as he or she withdraws the object from the input assembly, thereby allowing the user to determine how much further it is necessary to remove the object in order to complete the reversal of a selection of a respective key.

In another implementation according to the third aspect, the method further comprises recognizing a pattern of selection of values, and, upon recognizing the pattern, instructing performance of an action by an electronic device connected to the input assembly. Optionally, the pattern is a sequence of alphanumeric characters, and each of the alphanumeric characters is associated with a respective key region. Advantageously, the input assembly may thus be adapted for use in systems that require unlocking with a security code.

Optionally, the pattern is a gesture formed in reference to the entire input assembly. Advantageously, the plurality of image sensors is able to track an object across the entire input assembly, as opposed to only specific key surfaces. The combination of images obtained by the image sensors is thus capable of tracking a pattern traced by the user, such as a shape of a letter.

In another implementation according to the third aspect, each of the plurality of sensors is a time of flight sensor. Time of flight sensors are regularly used to calculate linear distance.

In another implementation according to the third aspect, the processing circuitry is configured to define three proximity regions relative to the key regions. The three proximity regions include a first region comprising linear distances further than a first predefined distance, a second region comprising linear distances closer than the first predefined distance and further than a second predefined distance, and a third region at or closer than the second predefined distance. The method further comprises: when the processing circuitry determines that the object moves from the third region to the second region and then from the second region to the first region, displaying the first visual indication and selectin the value; and when the processing circuitry determines that the object moves from the first region to the second region and then directly from the second region to the first region, without entering the third region, not instructing display of the first visual indication and not selecting the value. The method thus incorporates hysteresis, in that the movement from the second proximity region to the first proximity region generates a selection of a value only if the object had previously been in the third proximity region. The hysteresis serves to exclude unintentional sequential selections. This hysteresis is possible only with a sensor that is capable of measuring linear distance.

In another implementation according to the third aspect, the method comprises determining the location of the selected region through triangulation. For example, given data from any two sensors, it is possible to determine the location of the object based on the distance between those sensors and the vector of approach of the object to each of those sensors. It is further possible to improve the calculation by performing triangulation with more than two sensors, for example, with all the sensors in the array.

In another implementation according to the first aspect, each of the plurality of sensors is an image sensor. An image sensor is able to determine an approach of an object with a high degree of resolution and thus may also be used to determine linear distance. The image sensor may be a CCD pixel array. Advantageously, a CCD pixel array is a simple, inexpensive form of image sensor that is capable of performing the functions described herein.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a schematic depiction of an input assembly configured as a keypad, according to embodiments of the present disclosure;

Figure 6A:
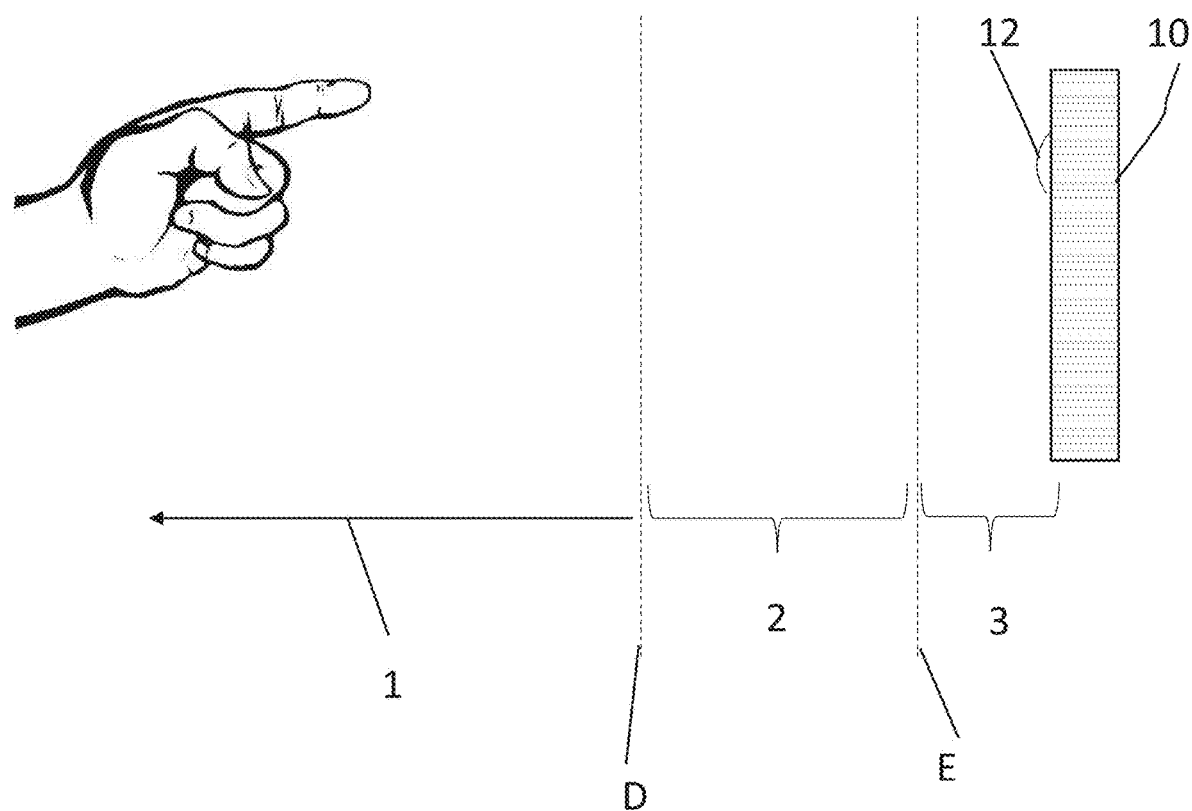
FIG. 6A depicts three proximity regions defined based on linear distances from the key regions or buttons, according to embodiments of the present disclosure.
Figure 6B:
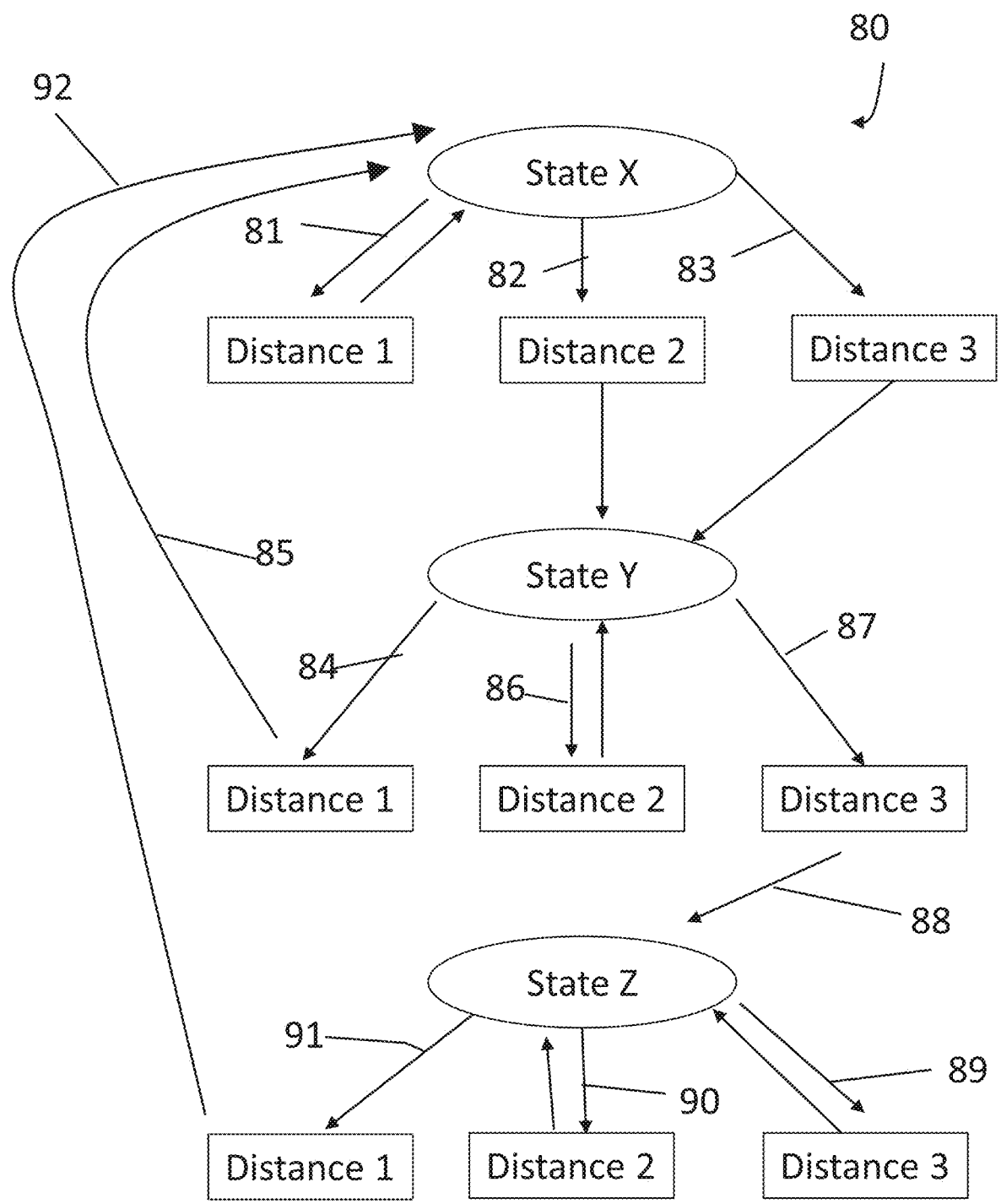
Figure 7:
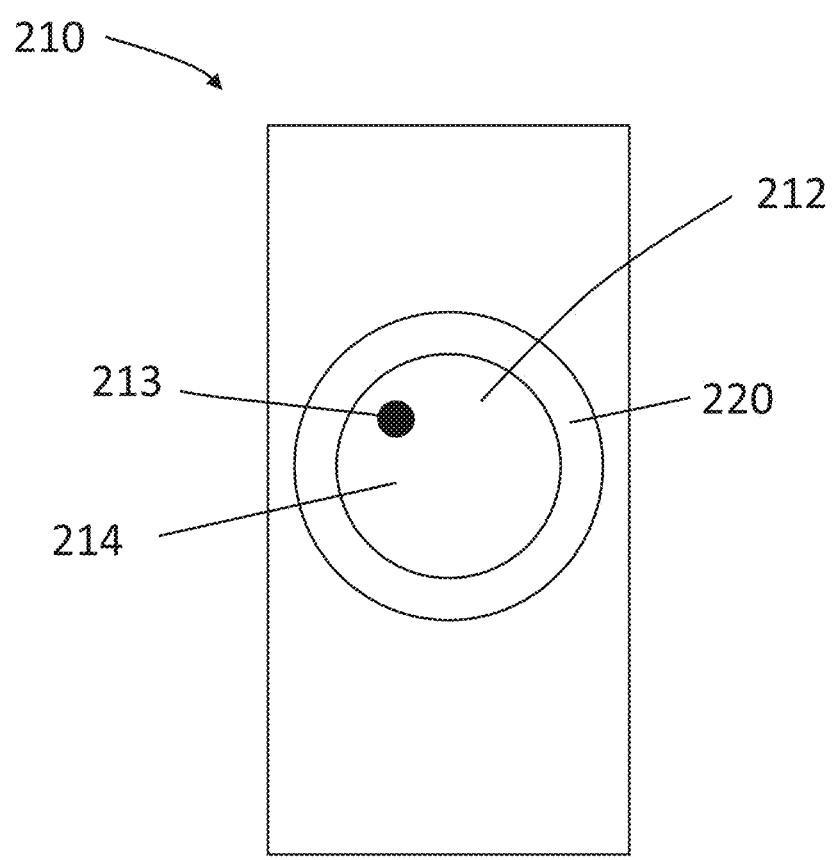

FIG. 6B schematically depicts application of an algorithm using the proximity regions of FIG. 6A for employing hysteresis to limit selections of a button or key region, according to embodiments of the present disclosure; and FIG. 7 depicts an input assembly comprising a single button, according to embodiments of the present disclosure.

DESCRIPTION OF SPECIFIC EMBODIMENTS OF THE INVENTION

The present invention, in some embodiments, relates to a touchless input device, and more specifically, but not exclusively, to a touchless input device with a plurality of time of flight sensors capable of measuring linear distance and providing feedback to a user as an object approaches the input device.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring to FIG. 1, input assembly 10 comprises a plurality of key regions 12. Each of the key regions 12 has a key surface 14, with a visual indicator 16 displayed thereon. In the illustrated embodiment, the visual indicators are alphanumeric symbols. A different visual indicator 16 is displayed for key region 12, so as to differentiate each key region 12 from the other key regions 12. The visual indicators 16 are arranged in a plane. As used in the present disclosure, arrangement on a plane encompasses arrangement on substantially planar devices, or objects that appear to a user as being essentially planar, such as a curved screen.

Each key region 12 additionally comprises an aperture 13 through which one or more sensors is placed. The sensor may be a time of flight sensor 24, as in the embodiment of FIG. 2A, or an image sensor 124 with a lens 118, as in the embodiment of FIG. 2B. In addition, each key region 12 may include a perimeter 20. The perimeter 20 need not have the dimensions relative to the visual indicator 16 illustrated herein, and may be relatively larger or smaller, so long as it encompasses the visual indicator. Speaker 11 is also optionally configured within input assembly 10.

The input assembly 10 may be configured within a screen, which is contiguous along its entire surface, with the exception of the apertures 13. In these embodiments, the key regions 12 correspond to regions within the screen, and the visual indicators 16 are displayed on the screen. Alternatively, each key region 12 may be configured within a separate screen. The screen or screens may be touch screens, in which case the regions are also responsive to touching of key surface 14 by a user. The screen or screens may also be non-touch screens, in which the visual indicators 16 merely delineates respective areas that correspond to key regions configured in front of the screen.

Alternatively, the visual indicators 16 may be located on separate keys in a keypad. In such embodiments, the key regions 12 are delineated by visual indicators located on individual keys in the keypad. The keypad may consist of functioning keys, which contain electronic circuitry that is responsive to depression of the key surface 14 by a user. Alternatively, the key pad may be a nonfunctioning keypad, such as a group of stickers arranged on a planar surface, which is solid except for the apertures 13, and the keypad merely delineates respective areas that correspond to key regions 12 configured in front of the keypad.

Input assembly 10 may be attached to an electronic device, such as an ATM machine, a credit card reader, an elevator, an electronic lock, or an alarm system. Such electronic devices operate by responding to selection of a single key or a sequence of keys. In conventional systems, the user effects a selection of a key by either depressing or touching one or more keys. Key regions 12 are capable of being selected without contact, as will be discussed further herein, but may also incorporate this conventional functionality, as discussed above.

Each key region 12 may have a diameter of less than approximately 20 mm, or less than 17 mm, or even less than 14 mm. The typical adult human index finger is between 16 and 20 mm wide. Conventional keys on a computer keyboard are approximately 19 mm wide, although some are as small as approximately 17 mm. Conventional keys on an ATM keypad are approximately 20 mm wide, although some ATM keys are approximately 15 mm wide, or even smaller. Thus, the key regions 12 are capable of distinguishing between selections at the smallest level typically achievable by an adult human finger. This functionality is enabled by the plurality of image sensors, which, through a combination of inputs from each of the image sensors, is able to determine approach of a finger or finger-sized object at high resolution.

This ability to distinguish finger-sized objects is an improvement compared to known contactless sensors, which, due to their use of infrared imaging with comparatively low resolution, are unable to distinguish between a finger and a hand. Infrared sensors are capable of imaging such small objects only if the sensors themselves are comparatively large. This size limitation renders infrared sensors impractical for small keypads such as card-sized keypads that are typically used for an ATM machine or a credit card reader. Use of an infrared sensor in such keypads would result in a high probability of erroneous selections. Use of time of flight sensors, by contrast, enables a precise measurement of linear distance, which may be used to accurately determine a selected key accurately. Likewise, the use of image sensors substantially increases the resolution compared to infrared imaging, and enables correct identification of each key region selected by the finger.

Figure 2A:
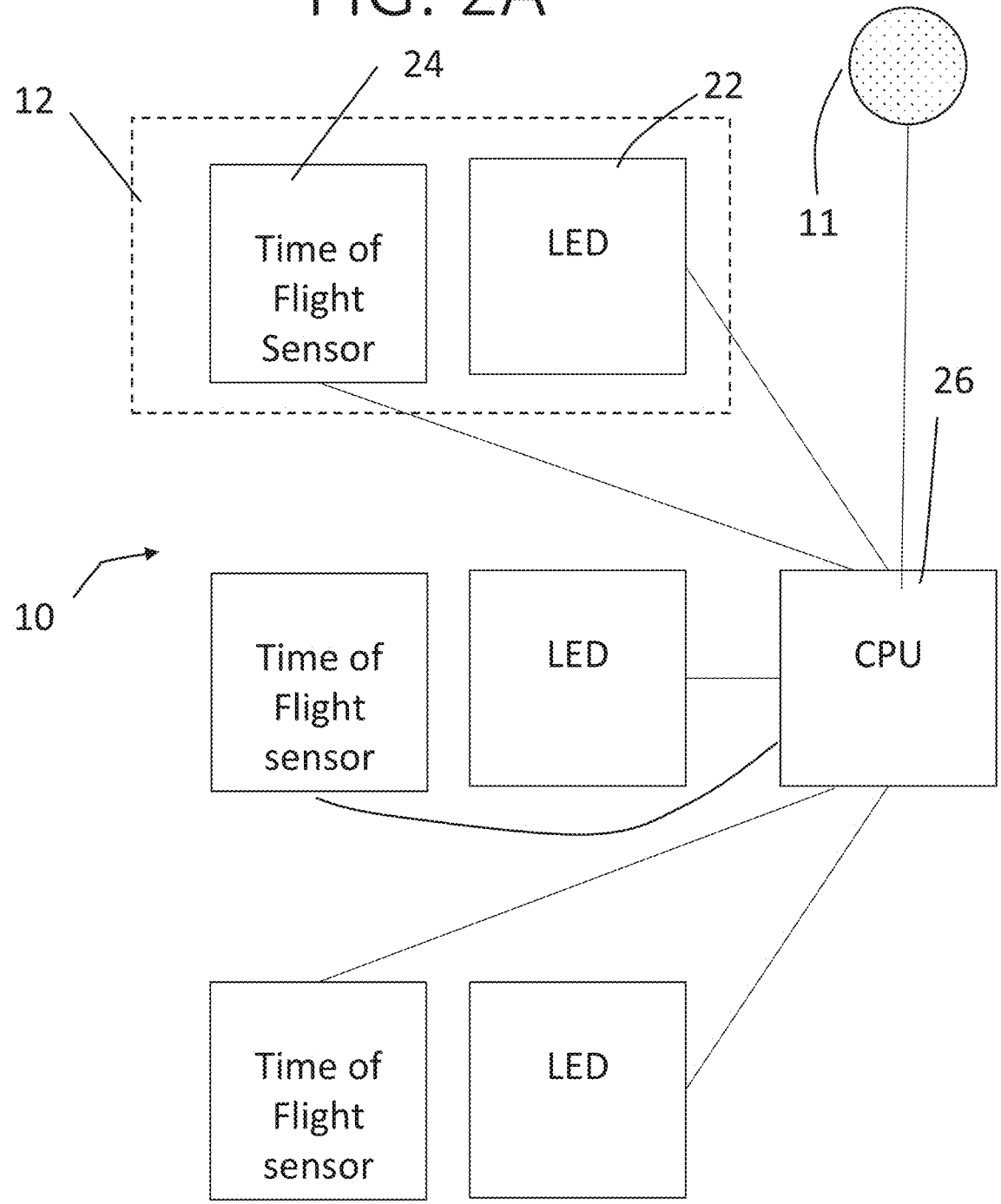
FIG. 2A is a schematic depiction of internal components of a first embodiment of the input assembly of FIG. 1, in which each key region has a time of flight sensor, according to embodiments of the present disclosure.

Reference is now made to FIG. 2A, which schematically illustrates various internal components of a first embodiment of input assembly 10. In the illustrated embodiment, internal components for a row of three key regions 12 are shown. It is to be understood that the same components are present in all key regions 12.

As shown in FIG. 2A, input assembly 10 includes processor 26, which is operatively connected to each of the key regions 12 and to speaker 11. The processor may also be referred to herein as processing circuitry. Processor 26 may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Computer readable program instructions described herein can be downloaded to respective computing/processing devices from a computer readable storage medium or to an external computer or external storage device via a network, for example, the Internet, a local area network, a wide area network and/or a wireless network.

The computer readable program instructions may execute entirely on the processor 26, partly on the processor 26, as a stand-alone software package, partly on the processor 26 and partly on a remote computer or entirely on the remote computer or server. In the latter scenario, the remote computer may be connected to the processor 26 through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Processor 26 is electrically connected to light source 22 and time of flight sensor 24. Light source 22 may be any compact light source, such as an LED. Light source 22 may include a plurality of LEDs. The plurality of LEDs may be configured around perimeter 20 of the key region 12. Alternatively, the key surface 14 may be partially or entirely translucent, and the LEDs may be configured behind key surface 14. The LEDs may be configured in one or more geometric shapes, such as a circle, concentric circles, a square, or concentric squares. In the illustrated embodiment, light source 22 is depicted as substantially behind key surface 14. However, light source 22 may be located in a different location, so long as it is able to project light specifically to a particular key region 12. Similarly, it is also possible that certain light sources 22 may be utilized for more than one key region 12. Time of flight sensor 24, which may also be referred to as a time of flight camera, is a range imaging camera system that employs time-of-flight techniques to resolve distance between the camera and the subject for each point of the image, by measuring the round trip time of an artificial light signal provided by a laser or an LED. The time of flight sensor 24 generally operates according to principles of time of flight sensors that are known, or that may become known, to those of skill in the art.

Figure 2B:
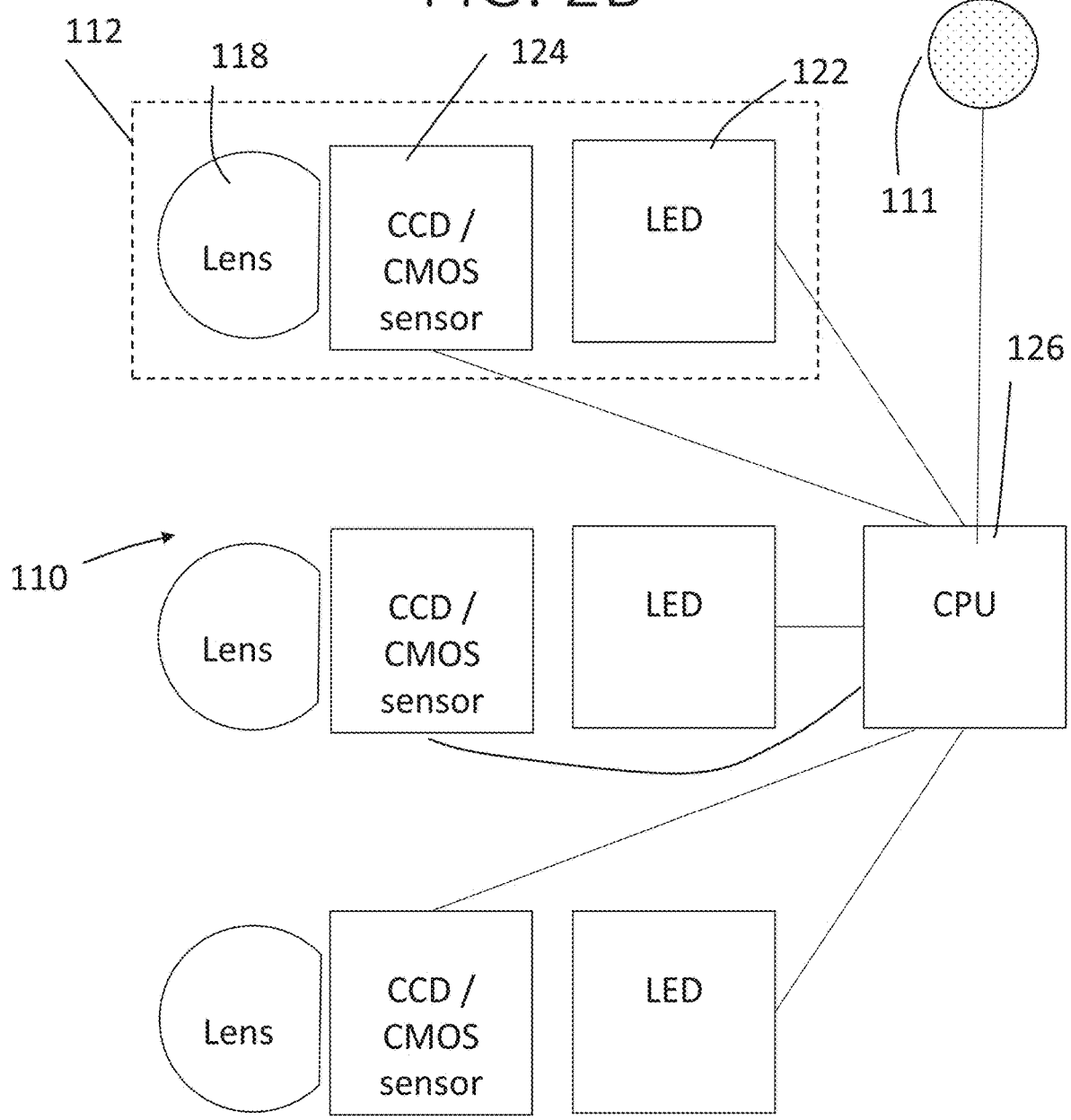
FIG. 2B is a schematic depiction of internal components of a second embodiment of the input assembly of FIG. 1, in which each key region has an image sensor, according to embodiments of the present disclosure.

FIG. 2B schematically depicts a second embodiment of an input assembly 110. Input assembly 110 is similar to input assembly 10 in most respects, and accordingly similar reference numerals are used to refer to similar features, except that the reference numerals are preceded with "1." Instead of a time of flight sensor, input assembly 110 includes image sensor 124. Image sensor 24 may be connected to one or more lenses 118, which are configured within, or behind, the apertures in key surfaces 114. Each image sensor 124 associated with a particular key region 112 may include one or more image sensors. The image sensors 124 may be cameras, including endoscopic cameras, or any type of imaging sensors, including active-pixel sensors (e.g. CMOS sensors and charge-coupled devices (CCDs)), and/or the like. The image sensors 124 may optionally be a CCD pixel array, for example, a 4×4 CCD pixel array. The image sensors may be configured to capture images at a suitable rate for object recognition and analysis, for example, up to around 60 frames per second.

Figure 3A:
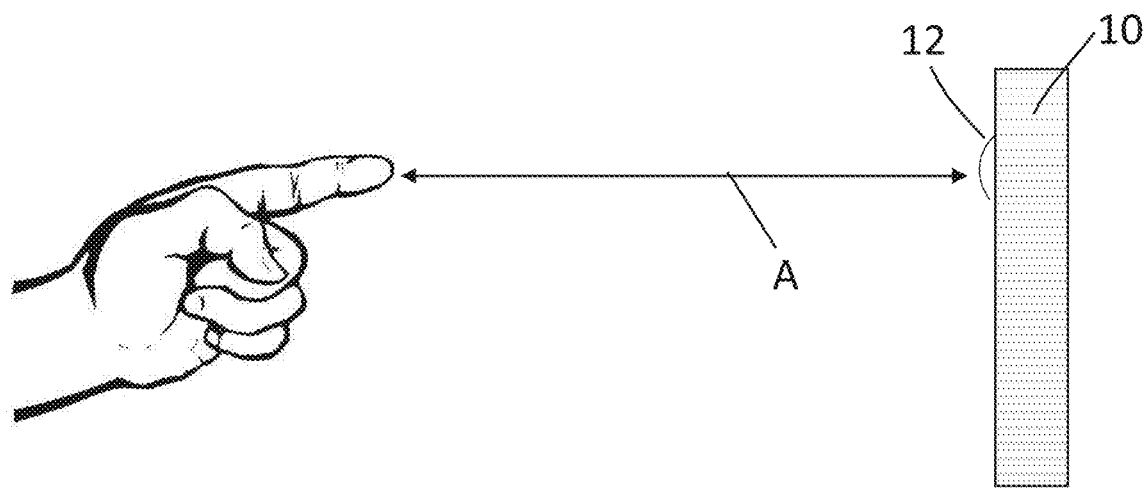
FIGS. 3A-3C illustrate displaying of a visual indication in increasing intensity as a user's finger approaches a key region in the input assembly of FIG. 1, according to embodiments of the present disclosure.
Figure 3B:
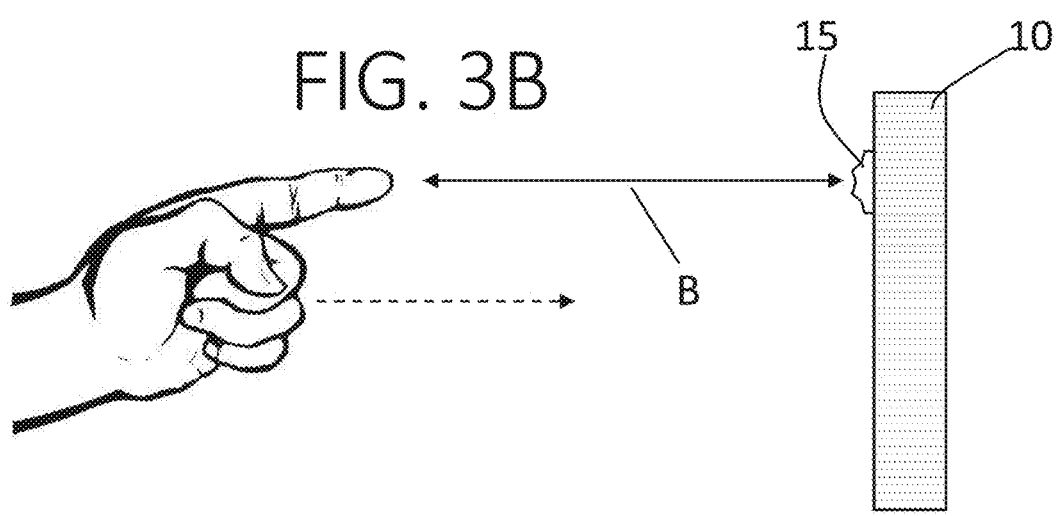
Figure 3C:
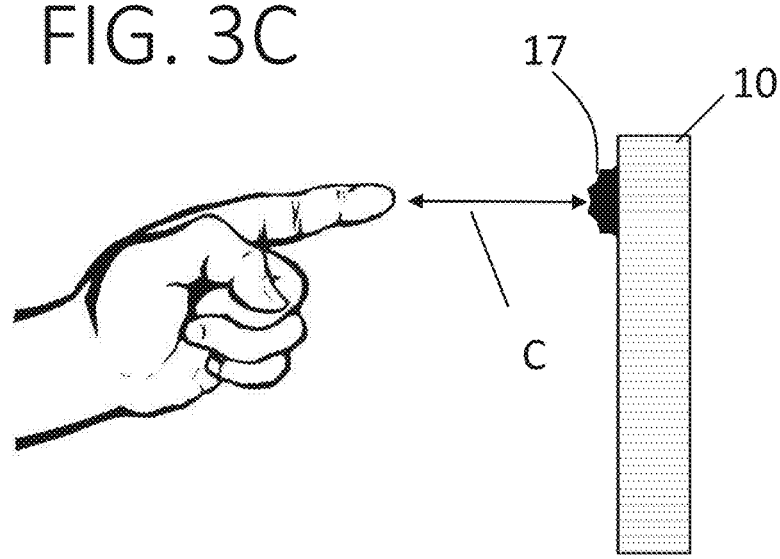

Reference now is made to FIGS. 3A-3C, which depict the displaying of a visual indication as a user's finger approaches a key region 12 in the input assembly 10.

In FIG. 3A, a user's finger is located a distance "A" from key region 12. In the embodiment of FIG. 2A, each time of flight sensors 24 transmits a pulse of light, which is reflected off of the user's finger, and the reflection is received by the time of flight sensor 24. Based on the time required for the reflection to return to the respective time of flight sensor 24, the processor 26 determines a linear distance of the finger from each respective time of flight sensor 24. The processor 26 further determines a rate of approach of the finger to each of the time of flight sensors 24, as a vector, based on a derivative of the linear distance. The processor 26 compares values for the linear distance and rate of approach for each of the plurality of sensors, to thereby determine a location of a selected key region 12 that the object is approaching. In a simple example, a user aims his or her finger directly at one of the key regions 12, and approaches that key region 12 in a straight line. In such cases, the selected key region would consistently have both the lowest calculated linear distance and the highest rate of approach, and thus identifying the selected key region 12 would be trivial. However, users are not always so predictable. The user may initially aim his or her finger at a location in between multiple key regions 12, or may change his or her mind regarding which key region 12 to select. In such scenarios, a more involved analysis may be required. One such analysis involves triangulation. Because the linear distance between each of the time of flight sensors 24 within the plane of the key matrix is known, those distances, in combination with each of the vectors corresponding to the rate of approach of the finger to different sensors, may be used to triangulate the location of the finger. This triangulation may be performed with data from a minimum of two time of flight sensors. For greater accuracy, data from all of the time of flight sensors may be included in the triangulation.

In the embodiment of FIG. 2B, the image sensors 124 receive images of the user's finger and transmit those images to processor 126. The processor 10 analyzes the plurality of images and determines that an object is present, as well as the distance of the object from the key regions 112.

By way of example, the processor 126 receives images from each individual camera 124, and creates, for each image, a matrix of values for each key region 12 on input assembly 110. For example, when a finger approaches the key region 112 with visual indicator "8," in the middle of the third row in the depicted embodiment, the image sensors 124 in the top row will image the finger in only the lower part of their respective fields. The image sensors 124 in the second row will image the finger in a greater portion of the lower part of the field. The image sensors 124 in the bottom row will image the finger in the upper portion of the field. Within the third row, the image sensors 124 for key regions "7" and "9" will image objects in respective sides of the field, and the image sensor 124 for key region "8" will image the finger in the center of the field. The processor 126 converts each of the images into a matrix of values representing the proximity of an object to each key region 112. The processor then combines the matrixes to determine the location of the finger with reference to the input assembly 110.

Unless specified otherwise, the remainder of the discussion below regarding response to placement of a finger near the input assembly is applicable regardless of whether the method used to determine linear distance is based on time of flight sensors or image sensors. For simplicity, only a single set of reference numerals will be used to refer to both embodiments.

Optionally, the processor 26 may use an object recognition algorithm and identify the object as an index finger. The object recognition algorithm may be, for example, a deep learning algorithm, or an algorithm based on a convolutional neural network (CNN). However, it is not necessary for the processor 26 to affirmatively identify the object, so long as it is able to determine the proximity of the object to the key region 12.

Optionally, when a user places a finger—or even any portion of the hand—within proximity "A" of the input assembly 10, the input assembly 10 displays a visual indication which is not specific to any of the key regions 12. For example, all of the key regions 12 may light up in a particular color, such as blue. This visual indication may indicate to the user that the input assembly 10 is functional and ready to receive a selection of a particular key region 12.

In FIG. 3B, the finger has advanced to distance "B" from key region 12. Distance "B" may also be referred to herein as a "second predefined proximity." The processor 26 analyzes the vectors derived from the time of flight sensors 24, or the processor 126 analyzes the images from the plurality of image sensors 124, and determines the approach of the finger to distance B from a particular key region 12. Upon detecting the advance of the finger to the second predefined distance of a particular key region 12, the processor 26 instructs selection of that key region. The processor further instructs changing the display of the visual indicator 16 of the selected key region by highlighting the selected key region with a visual indication 15. The visual indication 13 may be, for example, a display of a light around the perimeter 20, or a display of light at a first degree of brightness in an area behind the visual indicator 16, for example, in the key surface 14. The visual indication 15 may be displayed by means of light source 22 located behind the selected key region 12, or any of the other light sources 22 configured in the input assembly 10. Visual indication 15 is also referred to herein as a "second visual indication:"

Optionally, the processor 26 may refrain from instructing display of the visual indication unless it determines, to a threshold degree of confidence, that the object is a finger. The threshold may be, for example, 90% or 99%. In addition or alternatively, the processor 26 may refrain from instructing display of the visual indication unless it determines that the object is no wider than a finger. For example, the processor may recognize advances by a pen or a stylus, but not acknowledge advances by a closed hand or a handbag.

In FIG. 3C, the finger has advanced to distance "C" from key region 12. Distance "C" may also be referred to herein as a "first predefined proximity." First predefined distance C may be sufficiently far from the key surfaces 14 to prevent the user from accidentally contacting the key surfaces 14.

Upon detecting advance of the finger to the first predefined distance, the processor 26 instructs the light source 22 to display a different visual indication 17. Indication 17 may be different, for example, by being brighter than indication 15; covering more of the perimeter 20 than indication 15; covering more of the area or key surface 14 than indication 15; or being a different color than indication 15. Indication 17 is also referred to herein as a "first visual indication."

In addition, after the finger has advanced to distance C, the processor 26 selects, from a plurality of values, a value that is associated with the selected key region 12. For example, in the embodiment depicted in FIG. 1, the values may be the digits 0-9, enter, and star, with each value associated with a single key region 12. The processor 26 then outputs the selected value as a user-selected keypad value. For example, the processor may output the selected value to an electronic device connected to the input assembly 10.

Thus, in practice, indication 15 indicates to a user that he or she is approaching a particular key region 12, and that continuing the approach would result in a selection. Indication 17 indicates to a user that a selection has taken place. Knowing that the selection has taken place will help a user avoid extending his or her finger too far and inadvertently touching the one of the key surfaces 14.

Optionally, the processor 26 may instruct incrementally changing the second visual indication as the object is moved from the second predefined distance to the first predefined distance. This incremental change in the second visual indication is made possible through the use of sensors that are able to continuously determine distance of the object from the key regions. For example, time of flight sensors are able to repeat the time of flight distance measurements hundreds of times per second. Image sensors are able to continuously transmit images of the approaching finger to the processor 26, thereby enabling the processor 26 to continuously update its determination of the distance from the finger to the key region 12. Advantageously, this incremental change provides continuous feedback to a user regarding whether he is close to effecting a selection of a particular key region 12. This functionality is unavailable in contactless systems that either rely on low-resolution sensors (such as infrared sensors) or that are capable of only binary feedback, such as laser-based systems.

Figure 4A:
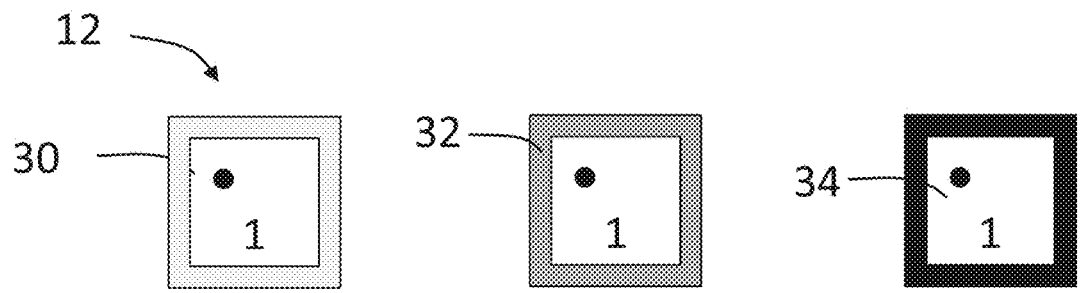
FIG. 4A illustrates displaying a visual signal around a perimeter of a key region, according to embodiments of the present disclosure.
Figure 4B:
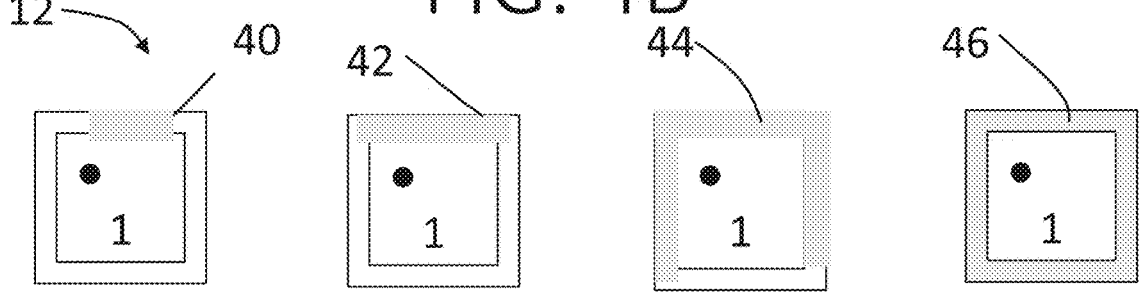
FIG. 4B depicts incrementally extending a visual signal around a perimeter of a key region, according to embodiments of the present disclosure.
Figure 4C:
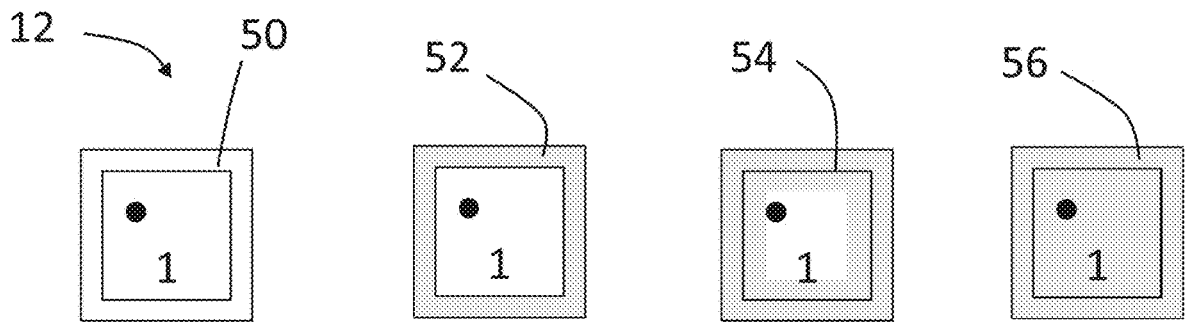
FIG. 4C depicts incrementally extending a visual signal within an area behind a visual indicator in a key region, according to embodiments of the present disclosure.

Examples of how the second visual indication is incrementally changed are shown in FIGS. 4A-4C. In FIG. 4A, the visual indication is located in the perimeter of each key region 12. Visual indication 30 is depicted as a light grey color, representing a comparatively low level of brightness; visual indication 32 is depicted as a heavier grey color, representing a higher degree of brightness; and visual indication 34 is depicted in a black color, indicating the highest degree of brightness, when the object has reached the first predefined distance. As can be recognized by those of skill in the art, the representation of three states of brightness is merely exemplary, and various different levels of brightness may be employed.

In FIG. 4B, the second visual indication is initially represented in a small portion 40 of the perimeter of key region 12. As the finger is drawn closer to the key region, the second visual indication is extended around the perimeter, as shown in exemplary indications 42 and 44. When the finger reaches the first predefined distance, the pattern around the perimeter is completed, as shown in indication 46.

In FIG. 4C, key region 12 is shown in state 50, without any visual indication, prior to approach of the finger to the second predefined distance. When the finger approaches the second predefined distance, a visual indication 52 is shown around the perimeter of key region 12. As the finger approaches the first predefined distance, the visual indication gradually fills the surface of key region 12, as shown with visual indication 54. When the finger reaches the first predefined distance, the visual indication fills the surface of key region 12, as shown with visual indication 56.

An audible indication from the speaker 11 may be modified similarly to the visual indication described above. For example, the audible indication may be a sound that is initially transmitted at low volume, and that is increased to higher volume as the finger approaches the key region. The audible indication may also be, for example, one or more words providing instruction to the user to proceed forward if he or she wishes to select a key region. The speaker 11 may output a different type of audible indication after the object reaches within the first predefined distance, to advise the user that a selection has been made.

The functionality described above with reference to drawing the finger closer to the input assembly may be employed equally well with respect to withdrawing the finger from the input assembly. A user that is intending to select a sequence of a plurality of key regions, for example for use in entering a security code in an ATM or an alarm system, may seek confirmation that he or she has withdrawn his or her finger sufficiently prior to selecting a new key region. By incrementally reversing the visual indication as the user withdraws his or her finger, the system provides a clear, ongoing indication to the user as to how close he or she is to completing the withdrawal.

Figure 5A:
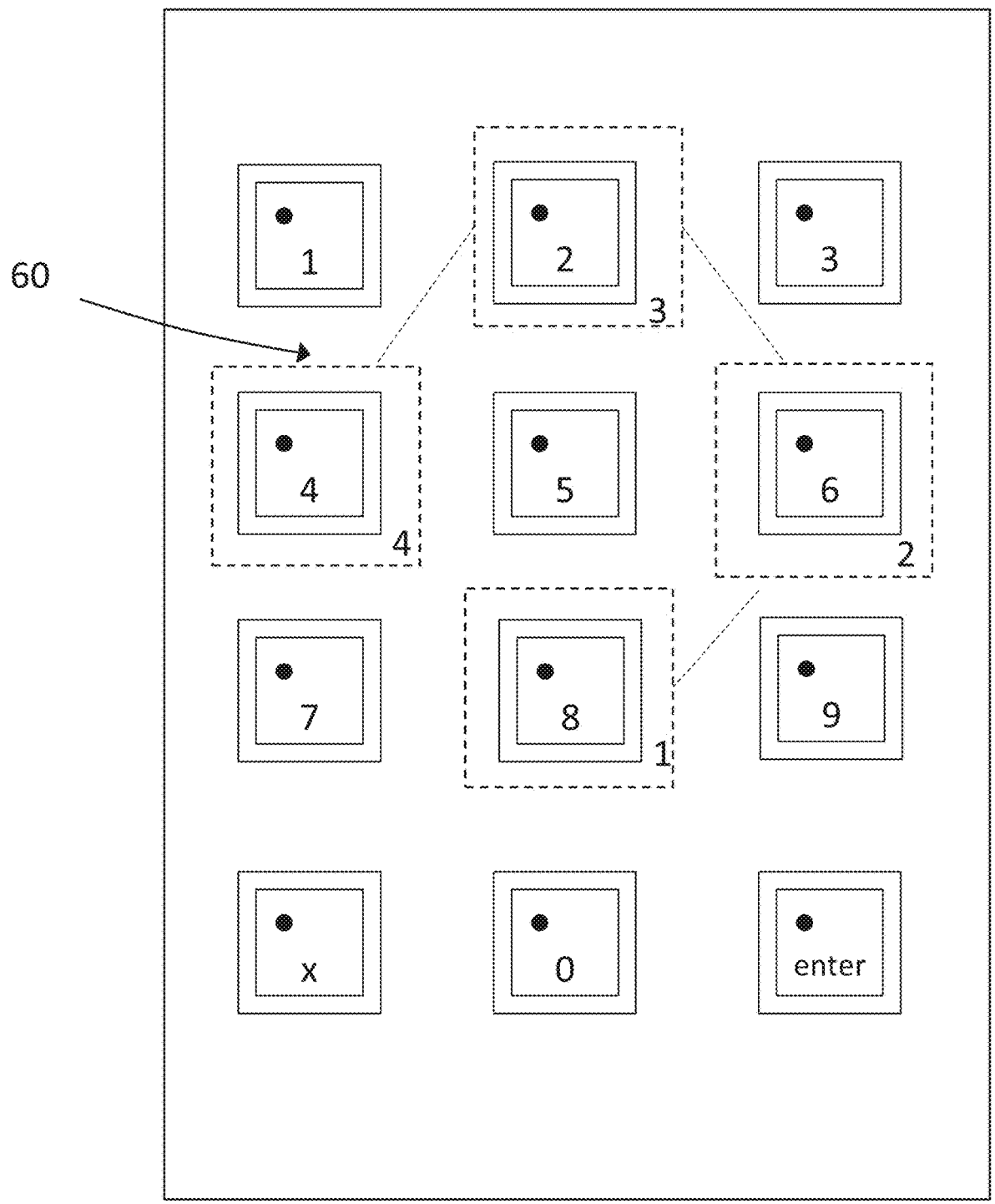
FIG. 5A depicts an alphanumeric sequence being selected on the input assembly of FIG. 1, according to embodiments of the present disclosure.
Figure 5B:
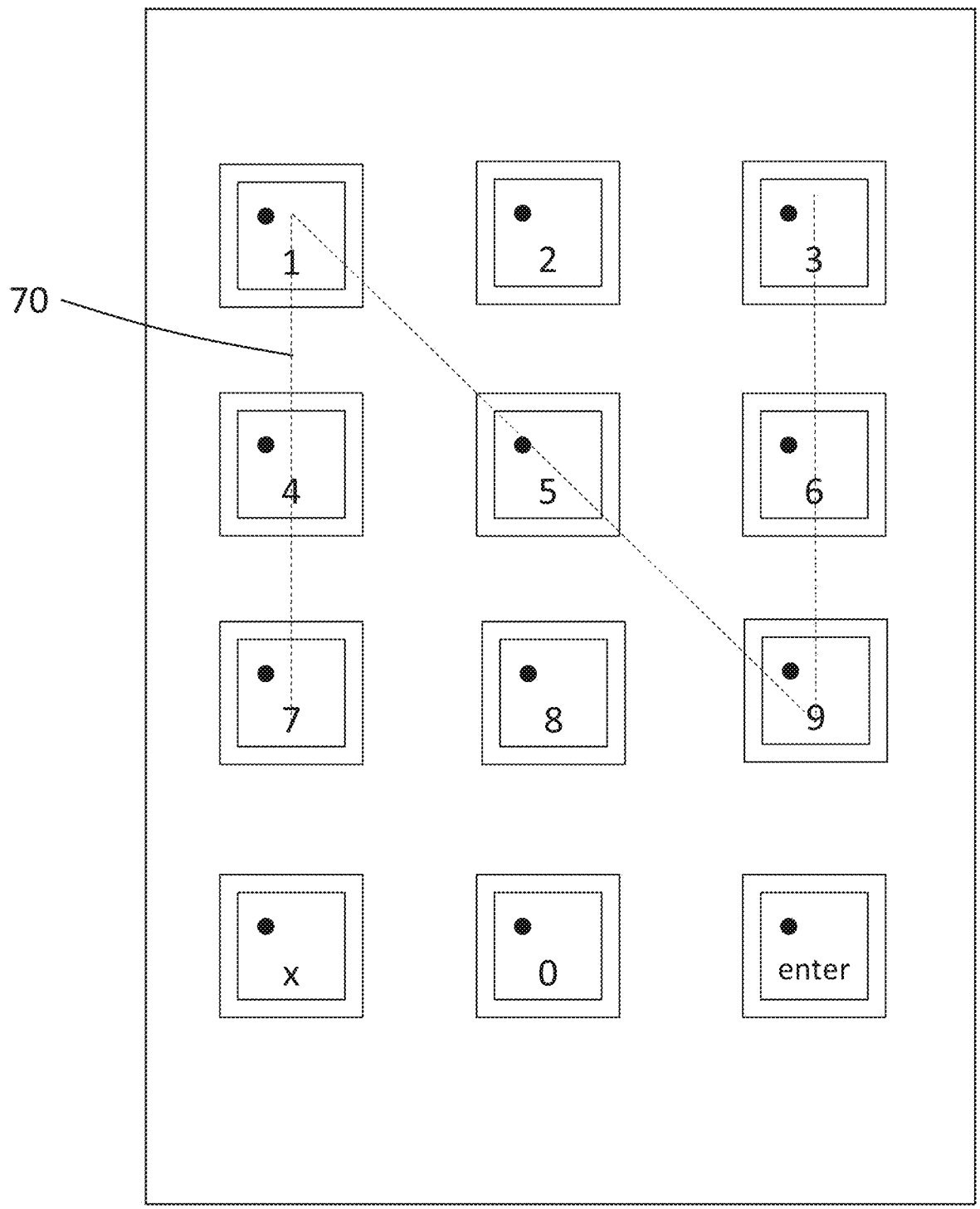
FIG. 5B depicts a gesture being displayed with reference to the input assembly of FIG. 1, according to embodiments of the present disclosure.

FIGS. 5A and 5B illustrate the input assembly 10 being used to detect a sequence or pattern of inputs. Input assembly 10 may be connected to an electronic device, such as an elevator or an electronically locked door. Upon recognition of a sequence or pattern of inputs, the processor 26 may instruct the electronic device to perform a certain action, such as moving the elevator to a selected floor or unlocking the door.

FIG. 5A depicts a user sequentially selecting keys 8, 6, 2, and 4. The processor 26 records the sequence of key entries 60 and instructs performance of the action.

FIG. 5B illustrates a user performing a gesture 70 in reference to the entire input assembly 10. In the illustrated embodiment, gesture 70 is the entry of a sequence of lines connecting individual key regions 12. Gesture 70 may also be in the shape of, a polygon, or a series of letters or numbers drawn by a user in the air, such as a signature. Thus, input assembly 10 may be used to replace credit card machines and the like that require drawing of a signature onto a screen with a finger or stylus. Using input assembly 10, the user may draw the signature entirely in the air, without touching the screen or a stylus. The processing circuitry determines that the user has entered the gesture 70, and instructs the electronic device to perform an action. This determination is particularly made possible through the use of a plurality of image sensors. Each image sensor images not only the area immediately in front of its own associated key region, but a portion of the surrounding area as well. Thus, in combination, the image sensors image the entire input assembly 10. By combining input from the plurality of image sensors, the input assembly 10 is able to track movement of the user's finger at all points along the face of the input assembly 10, and thus determine whether a gesture 70 is formed. The functionality is also available using time of flight sensors. Using triangulation, it is possible to determine the location of the finger at any point along the face of the input assembly 10, and not just points opposite the key regions 12.

FIGS. 6A and 6B depict defining of three proximity regions, and the application of an algorithm for employing hysteresis to limit selections of a button or key region, according to embodiments of the present disclosure. When entering a sequence of selections (as in FIGS. 5A and 5B), a user may inadvertently cause his or her finger to linger in the region between distances B and distances C of FIGS. 3A-3C. If the input assembly 10 were a binary system, configured to register a selection every time a user's finger entered within a given distance of the assembly, there would be a high risk of false selections. This is because the user may inadvertently place his finger within distance "C" more than once, in the process of preparing his or her next selection. This risk of false positive selections is endemic to any binary system that is capable of measuring only presence or absence of an object, without incorporating measurement of linear distance. By contrast, through the measurement of linear distance according to disclosed embodiments, it is possible to overcome this problem and ensure that only intentional selections are recorded.

As indicated in FIG. 6A, the processing circuitry 26 is configured to store two predefined linear distances "D" and "E" from input assembly 10. Distance E is the same as distance C described above in reference to FIG. 3C; that is, it is the distance at which a key selection is implemented. Distance D may be the same as distance A or B of FIGS. 3A and 3B, or it may be a different distance. Distances "D" and "E" define three proximity regions relative to the key regions 12. Proximity region 1 includes all linear distances further than distance D, and is also referred to herein as a "first region." Proximity region 2 includes all linear distances between distances D and E, and is also referred to herein as the "second region." Proximity region 3 includes all linear distances at or closer than distance D, and is also referred to herein as the "third region." FIG. 6B schematically depicts a decision tree 80 for responding to the presence of an object within the proximity regions 1, 2, and 3, or movement of an object between proximity regions 1, 2, and 3. The input assembly 10 may be in three states: X, Y, and Z. State X is a state in which no key region 12 is selected, and from which it is possible to enter state Y. State Y is a state in which no key region is selected, and from which it is possible to enter state Z and state X. In state Z, a key region 12 is selected. From state Z, it is possible to enter state X, but not state Y.

Referring to the top of decision tree 80, when the input assembly 10 is at rest, i.e., when no objects are close enough to the sensors to be measured, the input assembly is in state X. When the sensors determine that an object moves into proximity region 1, the processor 26 remains in state X, as shown at arrow 82. When the sensors determine that an object has moved into proximity region 2, the input assembly moves to state Y, as indicated at arrow 82. It is unusual that sensors determine that an object is in region 3 when in state X, because in order to reach region 3, it is necessary to pass through region 2. Nevertheless, in the event that the sensors determine that the object is in region 3 while the input assembly is in state X, the input assembly also moves to state Y, as indicated by arrow 83.

Referring to the middle of decision tree 80, when the input assembly 10 is in state Y, and determines that the object has moved back to region 1, the input assembly 10 moves from state Y to state X, as indicated by arrows 84 and 85. Arrow 85 thus represents a release of the input assembly 10 to a default state. When the input assembly 10 is in state Y and determines that an object is within region 2, it remains in state Y, as indicated by arrow 86. When the input assembly is in state Y and determines that an object has moved to distance 3, the input assembly moves from state Y to state Z, as indicated by arrows 87 and 88. Arrow 88 thus represents a selection of one of the key regions 12.

Referring now to the bottom of decision tree 80, when the input assembly 10 is in state Z, and it determines that the object is within region 3, it remains in state Z, as shown at arrow 89. Likewise, when the input assembly 10 determines that the object has been retracted to region 2, it continues to remain in state Z, as shown at arrow 90. Only when the input assembly 10 determines that the object has been retracted back to region 1 does it reset to state X, as shown at arrows 91 and 92. Like arrow 85, arrow 92 represents a release of the input assembly 10 to a default state.

In view of the foregoing description of each of the paths of decision tree 80, it is now possible to consider what happens when the object moves from region 2 to region 3. Specifically, the effect of this movement exhibits hysteresis—that is, the effect depends on the state of the input assembly 10 at the time of the movement. If the input assembly 10 is in state Y, then movement from region 2 to region 3 causes a change to state Z. In other words, this movement effects a selection of a key region 12. The input assembly 10 then registers the selection of a value corresponding with the selected key region 10 and displays a first visual indication, as discussed above in connection with FIGS. 3A-3C and 4A-4C. By contrast, if the input assembly 10 is in state Z, movement back and forth between regions 2 and 3 has no effect. The input assembly 10 remains in state Z. The input assembly 10 does not register a repeat selection of a value associated with a key region 12, nor does it display any visual indication. The only way to exit state Z, and thus make it possible to effect another selection of a key region 12, is to retract the object back to region 1. Thus, the functionality of the decision tree 80 protects against accidental repeat selections, by preventing a resetting of the input assembly 10 until the user has retracted the object back to region 1. This functionality is made possible due to the ability of input assembly 10 to determine linear distances and thus demarcate the three proximity regions 1, 2, 3.

FIG. 7 schematically depicts another embodiment of an input assembly 210. Input assembly 210 is similar in most respects to input assembly 10 and input assembly 110, and accordingly similar reference numerals are used to refer to similar elements, except that the reference numerals are preceded by a "2". The main difference between input assembly 210 and input assembly 10 or 110 is that input assembly 210 has only a single button 212. Button 212 may be, for example, a doorbell, a buzzer, an elevator call button, or a call button for a crosswalk.

Button 212 has a button surface 214 having a perimeter 220. Aperture 213 is arranged in front of either a time of flight sensor (not shown) or a lens connected to an image sensor (not shown) which is configured to image an object coming into proximity with the input assembly 210. Button 212 also includes a light source (not shown) configured to project a visual indication one or more of around the perimeter 220 of the button surface 214 or within the button surface 214. Processing circuitry (not shown) is connected to the image sensor and the light source, in the manner depicted in FIG. 2A with respect to input assembly 10 or in FIG. 2B with reference to input assembly 110. The processing circuitry is configured to, based on input from the time of flight sensor or image sensor, instruct changing of a display of the button with a first visual indication when the object approaches within a first predefined proximity of the button surface; instruct changing a display of the button with a second visual indication as the object is within a second predefined proximity of the button surface, said predefined proximity being further from the respective key surface than the first predefined proximity; instruct incrementally changing the second visual indication as the object moves from the second predefined proximity to the first predefined proximity; and output a selection of the button when the object approaches within the first predefined proximity. The first visual indication, second visual indication, and incremental changes may be the same as those discussed above, with reference to FIGS. 3A-3C and 4A-4C. Advantageously, the incremental changes in the display as the object approaches the first predefined proximity provides continuous feedback to the user, thus enabling the user to assess how much further is necessary to move his or her finger in order to effect a selection.

Input assembly 210 may also include additional elements and functionalities described above in connection with input assembly 10, including, but not limited to, a speaker, a visual indicator on the button surface 214, the ability to convey feedback to a user as he or she withdraws his or her finger from the button surface 214, and the ability to define multiple proximity regions and states, such that an effect of a movement of an object toward the input assembly 210 is subject to hysteresis.

It is expected that during the life of a patent maturing from this application many image sensors and light sources will be developed that are suitable for the functions described herein, and the scope of the terms image sensor and light source is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An input assembly, comprising:
   a plurality of visual indicators differentiating between a plurality of key regions on a plane;
   a plurality of sensors, each respective sensor arranged behind one of the plurality of key regions, and configured to determine a linear distance of an object from the respective sensor when the object is coming into proximity with the plane; and
   processing circuitry configured to:
      determine the linear distance of the object from each of the plurality of sensors;
      determine a rate of approach of the object to each of the plurality of sensors, as a vector, based on a derivative of the linear distance;
      compare values for the linear distance and rate of approach for each of the plurality of sensors, to thereby determine a location of a selected key region that the object is approaching;
      instruct changing of a display of at least one of the plurality of visual indicators to highlight the selected key region with a first visual indication when an object approaches within a first predefined proximity of the selected key region;
      select, from among a plurality of values, a value that is associated with the selected key region; and
      output the selected value as a user-selected keypad value.

2. The input assembly of claim 1, wherein the visual indicators are displayed on a single contiguous screen.

3. The input assembly of claim 1, wherein the visual indicators are located on separate keys in a keypad.

4. The input assembly of claim 1, further comprising circuitry for selecting the value associated with the respective key region by touching or depressing a key surface associated with the respective key region.

5. The input assembly of claim 1, further comprising a speaker, wherein the processing circuitry is configured to instruct the speaker to output an audible indication when the object approaches within the first predefined proximity of the respective key region.

6. The input assembly of claim 1, wherein the processing circuitry is configured to instruct highlighting the selected key region only when the object is determined to be a finger or an item no larger than a finger.

7. The input assembly of claim 1, wherein a diameter of each key region is less than 20 mm.

8. The input assembly of claim 1, wherein the first visual indication is a change in color of light or a change of degree of brightness of light.

9. The input assembly of claim 1, wherein the processing circuitry is configured to:
   based on input from the plurality of sensors, instruct highlighting the selected key region with a second visual indication when an object approaches within a second predefined proximity of the selected key region, said second predefined proximity being further from the respective key region than the first predefined proximity; and
   instruct incrementally changing the second visual indication as the object moves from the second predefined proximity to the first predefined proximity.

10. The input assembly of claim 9, wherein the second visual indication is a light pattern formed around a perimeter of the visual indicator of the selected key region or in an area behind the visual indicator of the selected key region.

11. The input assembly of claim 9, wherein the processing circuitry is configured to:
   based on input from the plurality of sensors, instruct reversal of the second visual indication incrementally as the object is withdrawn from the first predefined proximity to the second predefined proximity.

12. The input assembly of claim 1, wherein the processing circuitry is configured to recognize a pattern of selection of values, and, upon recognition of the pattern, to instruct performance of an action by an electronic device connected to the input assembly.

13. The input assembly of claim 12, wherein the pattern is a sequence of alphanumeric characters, wherein each of the alphanumeric characters is associated with a respective key region.

14. The input assembly of claim 1, wherein the pattern is a gesture formed in reference to the entire input assembly.

15. The input assembly of claim 1, wherein each of the plurality of sensors is a time of flight sensor.

16. The input assembly of claim 1, wherein the processing circuitry is configured to define three proximity regions relative to the key regions, the three proximity regions comprising: a first region comprising linear distances further than a first predefined distance; a second region comprising linear distances closer than the first predefined distance and within a second predefined distance; and a third region closer than the second predefined distance;
   wherein, when the processing circuitry determines that the object moves from the first region to the second region and then from the second region to the third region, the processing circuitry instructs displaying the first visual indication and selecting of the value, and when the processing circuitry determines that the object moves from the third region to the second region and then directly from the second region to the third region, without entering the first region, the processing circuitry does not instruct displaying the first visual indication and selecting of the value.

17. The input assembly of claim 1, wherein the processing circuitry is configured to determine the location of the selected key region through triangulation.

18. The input assembly of claim 1, wherein each of the plurality of sensors is an image sensor.

19. A method of providing feedback with an input assembly, wherein the input assembly comprises a plurality of visual indicators differentiating between a plurality of key regions on a plane, a plurality of sensors, each arranged behind one of the plurality of key regions, and configured to determine a linear distance of an object coming into proximity with the plane, and processing circuitry, the method comprising:

determining the linear distance of the object from each of the plurality of sensors;

determining a rate of approach of the object to each of the plurality of sensors, as a vector, based on a derivative of the linear distance;

comparing values for the linear distance and rate of approach for each of the plurality of sensors, to thereby determine a location of a selected key region that the object is approaching;

instructing changing of a display of at least one of the plurality of visual indicators to highlight the selected key region with a first visual indication when an object approaches within a first predefined proximity of the respective key surface;

selecting, from among a plurality of values, a value that is associated with the selected key region; and outputting the selected value as a user-selected keypad value.

* * * * *